US006998940B2

(12) United States Patent
Metzger

(10) Patent No.: US 6,998,940 B2
(45) Date of Patent: Feb. 14, 2006

(54) COMPONENT OPERATING WITH BULK ACOUSTIC WAVES AND A METHOD FOR PRODUCING THE COMPONENT

(75) Inventor: Thomas Metzger, Munich (DE)

(73) Assignee: EPCOS Inc., Munich (DE)

( * ) Notice: Subject to any disclaimer, the term of this patent is extended or adjusted under 35 U.S.C. 154(b) by 47 days.

(21) Appl. No.: 10/757,841

(22) Filed: Jan. 15, 2004

(65) Prior Publication Data

US 2004/0145430 A1    Jul. 29, 2004

(30) Foreign Application Priority Data

Jan. 15, 2003    (DE)    ................................ 103 01 261

(51) Int. Cl.
*H03H 9/54*    (2006.01)
*H03H 9/15*    (2006.01)
*H03H 3/02*    (2006.01)

(52) U.S. Cl. ...................... 333/187; 333/189; 310/335; 29/25.35

(58) Field of Classification Search ........ 333/186–192; 310/322, 335; 29/25.35
See application file for complete search history.

(56) References Cited

U.S. PATENT DOCUMENTS

| | | | |
|---|---|---|---|
| 3,568,108 A | * | 3/1971 | Poirier et al. ............... 333/187 |
| 5,872,493 A | * | 2/1999 | Ella ............................ 333/191 |
| 6,060,818 A | | 5/2000 | Ruby et al. ................. 310/363 |
| 6,107,721 A | * | 8/2000 | Lakin .......................... 310/321 |
| 6,329,305 B1 | | 12/2001 | Bower et al. ............... 438/800 |
| 6,342,134 B1 | | 1/2002 | Barber et al. .......... 204/192.18 |
| 6,407,649 B1 | * | 6/2002 | Tikka et al. ................. 333/133 |
| 6,441,703 B1 | * | 8/2002 | Panasik ....................... 333/189 |
| 6,496,085 B1 | | 12/2002 | Elläet et al. ................ 333/189 |
| 6,534,900 B1 | * | 3/2003 | Aigner et al. ............... 310/326 |
| 6,542,054 B1 | | 4/2003 | Aigner et al. ............... 333/187 |
| 6,720,844 B1 | * | 4/2004 | Lakin .......................... 333/189 |
| 2002/0084873 A1 | | 7/2002 | Ella et al. | |
| 2003/0227357 A1 | * | 12/2003 | Metzger et al. ............. 333/189 |

FOREIGN PATENT DOCUMENTS

| | | |
|---|---|---|
| DE | 101 49 542 A1 * | 4/2003 |
| WO | WO 01/24361 | 4/2001 |

* cited by examiner

*Primary Examiner*—Barbara Summons
(74) *Attorney, Agent, or Firm*—Schiff Hardin LLP

(57) ABSTRACT

A component operating with bulk acoustic waves has a carrier substrate, a thin-film resonator and an acoustic mirror arranged between the resonator and carrier substrate. The acoustic mirror is formed by at least one high acoustic impedance layer, which is covered by a low acoustic impedance layer and the uppermost low impedance acoustic layer is planarized to form a flat planar surface on which the thin-film resonator is formed.

20 Claims, 4 Drawing Sheets

COMPONENT OPERATING WITH BULK ACOUSTIC WAVES AND A METHOD FOR PRODUCING THE COMPONENT

BACKGROUND OF THE INVENTION

The present invention is directed to a component operating with bulk acoustic waves that comprises a thin-film resonator, which may be called a bulk acoustic wave resonator (BAW resonator) or a thin-film bulk acoustic wave resonator (FBAR). The invention is also directed to a method for producing this component.

Thin-film resonators play a role as filters for terminals or end devices for mobile telecommunication.

A thin-film resonator RE is schematically shown in FIG. 1 and comprises two electrodes E1 and E2 with a piezoelectric layer PS arranged between them. The thin-film resonator RE is arranged on a carrier substrate TS. It is possible to arrange the thin-film resonator over a recess provided in the carrier substrate. The propagation in the direction of the carrier substrate of the acoustic waves generated in the resonator is thereby prevented by the recess. Another possibility, as illustrated in FIG. 1, is to arrange an acoustic mirror AS between the resonator RE and the carrier substrate TS, which prevents the escape of the acoustic waves from the resonator in the direction of the carrier substrate TS. An acoustic mirror AS comprises, for example, an alternating sequence of layers HZ, which have a high acoustic impedance and layers LZ, which have a low acoustic impedance, so that the reflection of the acoustic waves occurs at the boundary surfaces of these layers. For example, conductive layers or, respectively, metal layers can be used as mirror layers HZ with high acoustic impedance. The thickness of the mirror layers is approximately ¼ of the wavelength of the acoustic wave in the material of the layer. In order to achieve a higher possible bandwidth in the component, the number of mirror layers should be kept as low as possible. For this, the impedance jump between the layers with different impedances must be as high as possible. In particular, when a plurality of resonators are arranged on a common acoustic mirror, the structure of the conductive layers in the mirror is necessary in order to reduce parasitic electrical couplings over a contiguous conductive layer within a filter, which is comprised of a plurality of resonators. An exemplary BAW resonator is shown in FIG. 2, in which two mirror layers with high acoustic impedance are respectively fashioned as a structure mirror layer HZ1, HZ2 and the mirror layers LZ with low acoustic impedance exhibit a constant thickness throughout.

The structuring of a layer influences the subsequent processing of the layers, for example, the electrode E1, piezoelectric layer PS and the electrode E2, of a thin-film resonator lying above it, since the subsequent layers to be processed must be guided over the edges KA generated during the structuring of the first layer. The discontinuities of the structure formed by the edges KA can, as the case may be, lead to interruptions or breaks of the layers arranged above them and, thus, impair the functionality of the entire component. A sufficient edge covering is, therefore, only possible given edges fashioned flat or with a slight height differences at the edges, in comparison to the slice thickness of the covered layer. A structuring method to generate flat edges or, respectively, the use of thicker layers is not always possible, for technological reasons or reasons of design technology.

U.S. Pat. No. 6,496,085 B2, whose disclosure is incorporated herein by reference thereto and which issued from U.S. Patent Application Publication, US 2002/0084873 A1, discloses a method for generating a structured acoustic mirror in which all mirror layers are first applied on the carrier substrate and are subsequently structured together by etching. Both high-impedance layers and low-impedance layers are thereby structured. The structures fashioned are embedded in a dielectric layer that is planarized before deposition of the layers of the thin-film resonator. However, this method has the disadvantage that an elaborate dry etching or different wet etching methods for high-impedance layers or for the low-impedance layers are necessary to structure the entire stack of layers. In the application of the dielectric layer, steps are generated corresponding to the height of the structured layer stack, whose planarization is more elaborate the higher the structures of the acoustic mirror.

SUMMARY OF THE INVENTION

It is an object of the present invention to provide a component operating with bulk acoustic waves with a structured mirror layer that prevents the problems mentioned hereinabove.

This object is achieved by an embodiment of the invention which comprises a component operating with the bulk acoustic waves. The component comprises a carrier substrate and at least one thin-film resonator arranged on this carrier substrate, the thin-film resonator comprises an upper and lower electrode with a piezoelectric layer or layers arranged between them. The component includes an acoustic mirror being provided between the thin-film resonator and the carrier substrate. The mirror comprises an alternating sequence of mirror layers which have a high acoustic impedance and a low acoustic impedance. The uppermost mirror layer exhibits a low acoustic impedance and each mirror layer with the high acoustic impedance that is arranged under the uppermost mirror layer is fashioned as a structured layer. The uppermost mirror layer exhibits a thickness varying over the surface of the mirror layer and encloses the structure of the structured layers and, moreover, seals the surface covered by the structure of the mirror layer with a lower acoustic impedance layer arranged below the structured layer or with the carrier substrate.

The mirror layers with the high acoustic impedance are preferably structured in a conventional photostructuring method, for example, photolithography. The mirror layers with low acoustic impedance are preferably not structured.

The upper boundary surface of the uppermost mirror layer is fashioned planar. A planar surface is particularly advantageous for subsequent processing of the layers of a thin-film resonator, since, for example, the electrodes must not be directed over the edges of the structured mirror layers.

In an advantageous modification of the invention, it is possible to structure a plurality of mirror layers with a high acoustic impedance in order to reduce the undesired capacitive coupling between different thin-film resonators arranged on the acoustic mirror via further conductive high-impedance layers of the acoustic mirror.

In another advantageous embodiment of the invention, in place of only one thin-film resonator, the inventive component comprises a resonator system fashioned as a stacked crystal filter, with at least two thin-film resonators stacked on top of one another and acoustically coupled with one another. At least one further or additional piezoelectric layer is thereby, for example, arranged on the upper electrode of the lowermost resonator. An additional electrode is provided on this additional piezoelectric layer.

In the system of acoustically coupled thin-film resonators in another embodiment at least partially permeable coupling layers can be provided between the upper electrode and the additional piezoelectric layer. It is especially advantageous if an electrode is arranged between the coupling layer and the additional piezoelectric layer.

The inventive component can, for example, be produced by a method having the following steps. First, a carrier substrate is provided. On the carrier substrate, mirror layers with low and high acoustic impedance are deposited one after the other in alternating sequence, whereby the first deposited mirror layer exhibits a high impedance. In the following step, the first deposited mirror layer is structured. As the uppermost layer, a mirror layer with low acoustic impedance that is fashioned with a varying thickness is subsequently deposited. The maximum thickness of this layer can advantageously exceed the total thickness of all structured layered thicknesses of the mirror, including the thickness of the uppermost mirror layer to be achieved in the later method. The uppermost mirror layer is subsequently thinned and planarized, for example by means of a chemical mechanical polishing. The lower electrode, the piezoelectric layer and the upper electrode are then deposited one after another on the planarized uppermost mirror layer.

In an advantageous embodiment of the invention, it is provided that additional mirror layers are provided and that the layers with the high acoustic impedance are structured. All mirror layers respectively deposited directly above the structured mirror layer can thereby be fashioned with low acoustic impedance with varying thickness. After the deposition, the maximum thickness of the respective mirror layer acoustic impedance initially exceeds the total thickness of all structured mirror layers, including the predetermined thickness or, respectively, minimum thickness of the respective mirror layer. The mirror layers with low acoustic impedance are subsequently thinned and planarized to form a planarized flat surface before a subsequent layer, which is selected from either a mirror layer with high acoustic impedance or a metal layer for the lower electrode of the thin-film resonator, is deposited on the planarized surface.

Compared to previous known bulk acoustic wave components with structured mirror layers, the invention offers the advantage that the surface of the acoustic mirror is planarized, which makes processing of the layers of the thin-film resonator easier and contributed to the reliability of the component. Wet-chemical etching methods can be cost-effectively used to structure the high-impedance layers. The abandonment of the structuring of the low-impedance layers offers the advantage that the height difference in the stacked structure of the acoustic mirror is kept low, which makes the planarization easier.

Other advantages and features of the invention will be readily apparent from the following description of the preferred embodiments, the claims and drawings.

DESCRIPTION OF THE PREFERRED EMBODIMENTS

Figure 1:
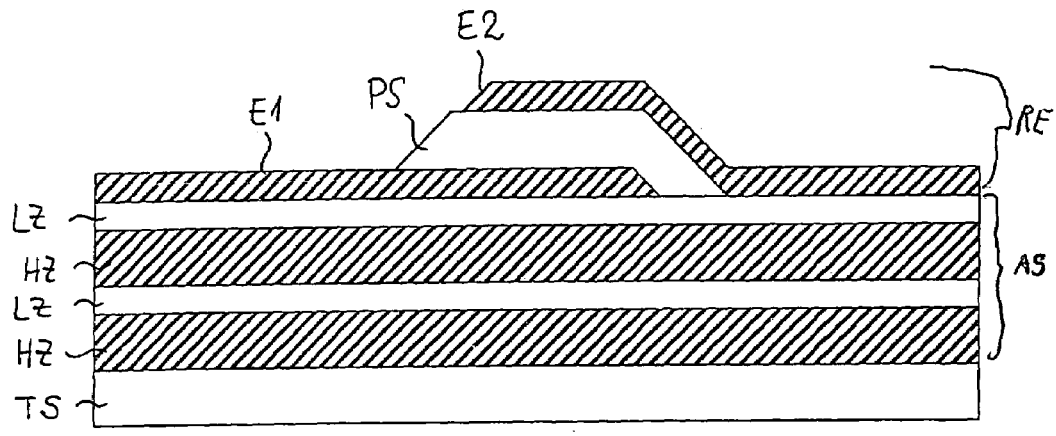
FIG. 1 is a schematic cross-sectional view of a known component operating with bulk acoustic waves.
Figure 2:
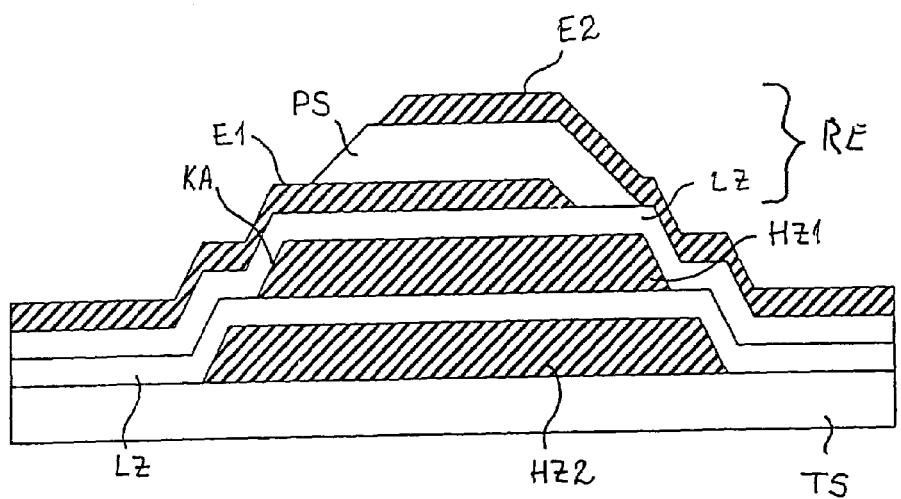
FIG. 2 is a schematic cross-sectional view of a known embodiment of a component operating with bulk acoustic waves.
Figure 3A:
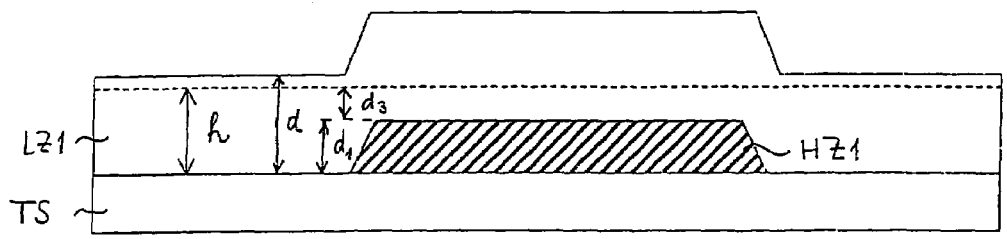
FIGS. 3a–3c are schematic cross-sectional views showing the method steps for forming an embodiment of the present invention, with FIG. 3a showing a cross-section of the layer assembly of an inventive component before a thinning or the planarization of the uppermost layer of the acoustic mirror, with FIG. 3b showing a cross-section of the layer assembly of an inventive component after the thinning or the planarization of the uppermost layer of the acoustic mirror, and with FIG. 3c showing a cross-section of the layer assembly of the inventive component after the deposition of the layers of the thin-film resonator.
Figure 3B:
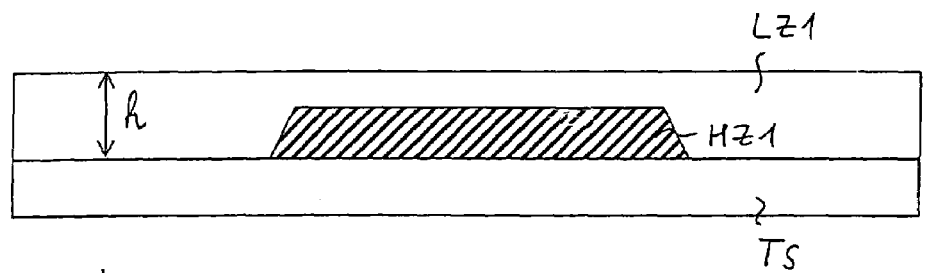
Figure 3C:
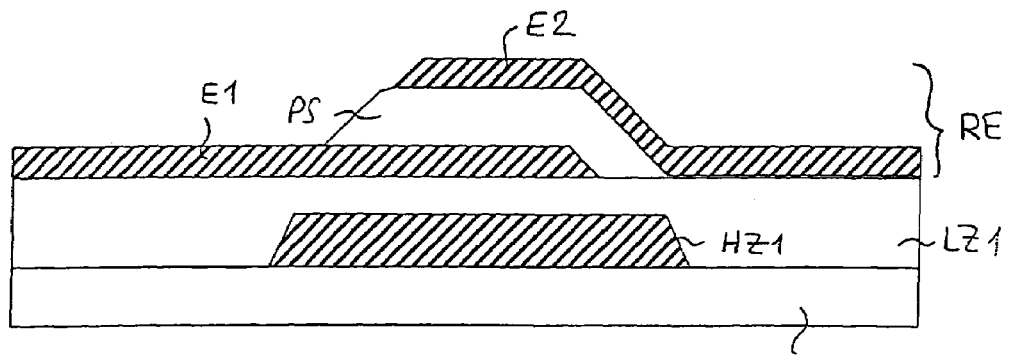

The principles of the present invention are particularly useful when incorporated in a component which has a two-layer acoustic mirror and is formed by the steps shown in FIGS. 3a–3c.

As illustrated in FIG. 3a, an acoustic mirror, which comprises a structured mirror layer HZ1 with a high acoustic impedance is disposed on a substrate TS and the structured layer HZ1 is covered by a mirror layer LZ1 of a low acoustic impedance. The uppermost mirror layer LZ1 is shown before the planarization of this layer and the height or thickness of the mirror layer LZ1 varies in the lateral direction. The height or thickness d, which is the minimum thickness of the layer LZ1 when it is applied, is no smaller than the total height or thickness h of the layer LZ1 after planarization. It is also possible that d is selected equal to h. The height h measures the sum of the thickness d1 of the structured mirror layer HZ1 and the minimum provided thickness d3 of the layer LZ1 directly above the upper surface of the structured mirror layer HZ1 after planarization.

FIG. 3b shows the layer assembly of the inventive component after the thinning and planarization of the surface of the uppermost mirror layer LZ1. The planarization forms a flat or planarized upper surface for the layer LZ1.

In FIG. 3c, the layer assembly of the finished inventive component is shown after processing the layers of the thin-film resonator RE. This is after the planarization of the surface of the uppermost layer LZ1, a lower electrode E1 is applied, and then structured followed by applying a piezoelectric layer PS, which is structured. After structuring the piezoelectric layer PS, the upper electrode E2 is formed on the layer PS by structuring a metal layer.

Figure 4A:
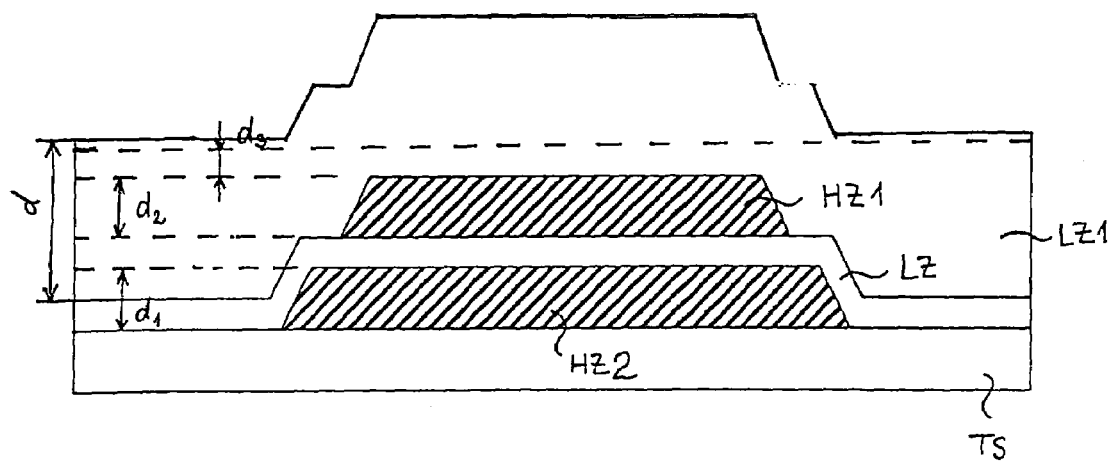
FIGS. 4a–4c are schematic cross-sectional views showing the layer assembly of another inventive component after various method steps, with FIG. 4a being a cross-section showing the component after providing the mirror layers and prior to planarization of the uppermost mirror layer, with FIG. 4b being a cross-section of the component with the uppermost layer of the mirror being planarized, and with FIG. 4c being a cross-section of the component after forming of a thin-film resonator.
Figure 4B:
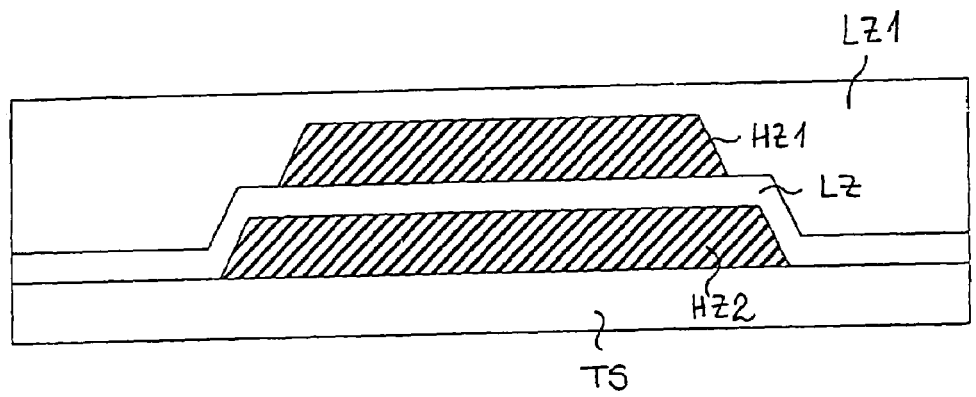
Figure 4C:
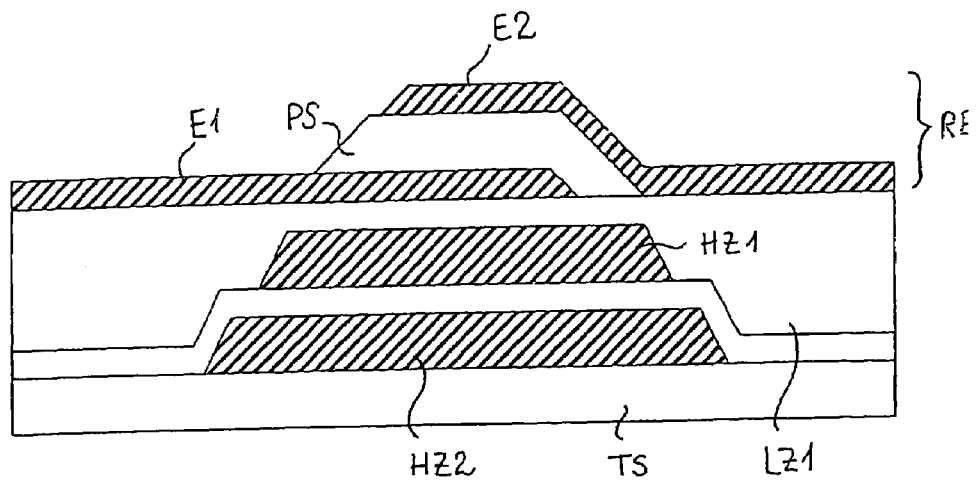

An embodiment of the invention is illustrated in FIGS. 4a–4c with each showing various steps in forming the four-layer acoustic mirror.

FIG. 4a shows a schematic cross-section of the layer assembly of the inventive component before the thinning or the planarization of the uppermost mirror layer LZ1 of the acoustic mirror. The uppermost mirror layer LZ1 exhibits a low acoustic impedance. A lower structured layer HZ2 has a thickness d1 and is separated by a mirror layer LZ from the upper structured layer HZ1, which has a thickness d2. The uppermost mirror layer LZ1 exhibits a varying thickness, whereby it, on the one side, overlies the structures of the upper structured layer HZ1 and, with the mirror layer LZ that extends between the two structured layers HZ1 and HZ2, seals the area not covered by these structures. The uppermost mirror layer LZ1, on the other side, exhibits, on the top, a planar boundary surface. The thickness d3, to be set in a later method step, of the uppermost mirror layer LZ1 with a lower acoustic impedance is indicated by a dashed line. After applying the uppermost mirror layer LZ1, the maximum thickness d of the uppermost mirror layer LZ1 is preferably larger than the sum d1+d2+d3 of the thicknesses of the structured layers HZ1, HZ2 and a predetermined thickness d3 of the uppermost mirror layer LZ1 after planarization, which thickness d3 is measured over the structure of the structured layer HZ1.

The mirror layers with high acoustic impedance can, for example, be effected by utilizing either tungsten (W) and/or molybdenum (Mo). The mirror layers with low acoustic impedance can be, for example, formed by silicon oxide. The thickness of the mirror layers is preferably a quarter of the wavelength of the acoustic wave in the given material.

The piezoelectric layer in the inventive resonator is preferably formed by AlN. It is also possible that the piezoelectric layer is composed of ZnO, $LiNbO_3$, $LiTaO_3$, polycrystalline quarts or other piezoelectric materials which may be placed in an arbitrary layer sequence of these materials.

The electrodes can be, for example, composed of a material selected from Al, W and Mo.

As shown in FIG. 4b, the uppermost mirror layer LZ1 has been planarized to provide the thin portion overlying the uppermost structured layer HZ1.

As shown in FIG. 4c, after the planarization of the uppermost mirror layer LZ1, the first and lower electrode layer E1 is deposited on the planarized layer LZ1 and then structured, then the piezoelectric layer PS is applied and structured and, finally, the uppermost electrode E2 is applied and structured to form the thin-film resonator RE.

It can be provided according to the invention that not only the uppermost mirror layer LZ1, but rather the lower layer LZ, which is between the layer HZ1 and HZ2 exhibit a varying thickness and are provided with a planar surface for the processing of further layers to be applied thereon.

Figure 5:
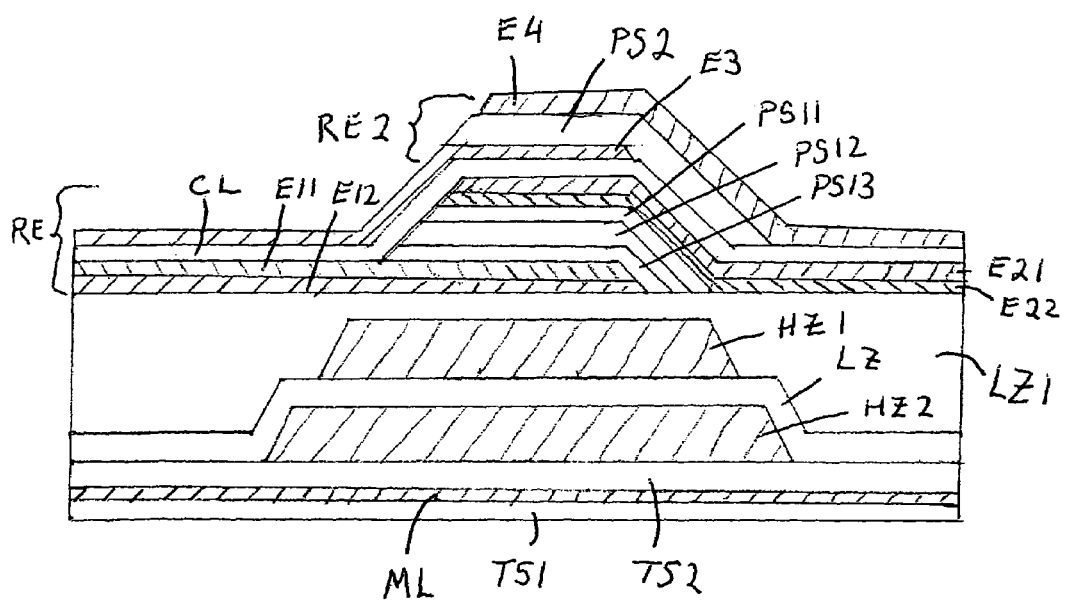
FIG. 5 is a schematic cross-sectional view of another embodiment of the component, which has a stack of two thin-film resonators.

The carrier substrate TS can comprise a multi-layer assembly, such as illustrated in FIG. 5, and is made of alternating arranged dielectric layers TS1 and TS2 and structured metal planes, such as ML. In the metal planes, integrated circuit elements can be realized via structured conductor traces and surfaces.

The electrodes, the piezoelectric layer and the mirror layers can respectively be formed from a plurality of layers. For example, as shown in FIG. 5, one electrode is shown by two metal layers E11 and E12, while the other electrode is shown by two layers E21 and E22, and the piezoelectric layer is formed by three layers PS11, PS12 and PS13.

In FIG. 5, the piezoelectric device is illustrated, which has a lower or first thin-film resonator RE formed on the upper surface of the layer LZ1. A second resonator RE2 is formed on the lower resonator and includes an upper electrode E4, a piezoelectric layer PS2 and a lower electrode E3. Preferably, a coupling layer CL is interposed between the lower electrode E3 of the upper resonator RE2 and the upper electrode formed by the layers E21 and E22 of the lower resonator RE.

Although various minor modifications may be suggested by those versed in the art, it should be understood that I wish to embody within the scope of the patent granted hereon all such modifications as reasonably and properly come within the scope of my contribution to the art.

I claim:

1. A component operating with bulk acoustic waves, said component comprising:
    a carrier substrate;
    a lower electrode that faces said carrier substrate;
    an upper electrode;
    a piezoelectric layer between said lower electrode and said upper electrode, said piezoelectric layer comprising a multi-layer assembly; and
    an acoustic mirror between said carrier substrate and said lower electrode, said acoustic mirror comprising at least one layer with a high acoustic impedance and at least one layer with low acoustic impedance arranged in a stack, said at least one layer of low acoustic impedance including an uppermost mirror layer of said stack, said at least one layer with high acoustic impedance being formed as a structured layer, said uppermost mirror layer exhibiting a varying thickness, an upper boundary surface of said uppermost mirror layer being planar to said lower electrode, and said uppermost layer enclosing a structure of said structured layer and forming a seal with a layer of said at least one layer with a low acoustic impedance or with said carrier substrate outside of an area covered by said structure.

2. A component according to claim 1, wherein said at least one layer with high acoustic impedance includes a plurality of layers which are structured.

3. A component according to claim 2, wherein said at least one layer with high acoustic impedance is formed of a material selected from a group consisting of tungsten and molybdenum, and said at least one layer with low impedance is formed of silicon oxide.

4. A component according to claim 1, wherein at least one of said upper electrode and said lower electrode is formed by a plurality of layers.

5. A component according to claim 1, wherein said at least one layer with high acoustic impedance is of a metal selected from a group consisting of tungsten and molybdenum, and said at least one layer with a low acoustic impedance is formed of silicon oxide.

6. A component operating with bulk acoustic waves, said component comprising:
    a carrier substrate;
    a lower electrode that faces said carrier substrate;
    an upper electrode;
    a piezoelectric layer between said lower electrode and said upper electrode;
    an acoustic mirror between said carrier substrate and said lower electrode, said acoustic mirror comprising at least one layer with a high acoustic impedance and at least one layer with low acoustic impedance arranged in a stack, said at least one layer of low acoustic impedance including an uppermost mirror layer of said stack, said at least one layer with high acoustic impedance being formed as a structured said uppermost mirror layer exhibiting a varying thickness, an upper boundary surface of said uppermost mirror layer being planar to said lower electrode, and said uppermost layer enclosing structures of said structured layer and forming a seal with a layer of said at least one layer with a low acoustic impedance or with said carrier substrate outside of an area covered by said structure;
    an additional piezoelectric layer being formed on said upper electrode and an additional electrode on said additional piezoelectric layer;

at least a partially permeable coupling layer between said upper electrode and said additional piezoelectric layer; and a second additional electrode between said at least a partially permeable coupling layer and said additional piezoelectric layer.

7. A component according to claim 6, wherein said at least one layer with high acoustic impedance includes a plurality of layers which are structured.

8. A component according to claim 7, wherein said at least one layer with high acoustic impedance is formed of a material selected from a group consisting of tungsten and molybdenum, and said at least one layer with low impedance is formed of silicon oxide.

9. A component according to claim 6, wherein at least one of said upper electrode and said lower electrode is formed by a plurality of layers.

10. A component according to claim 6, wherein said at least one layer with high acoustic impedance is of a metal selected from a group consisting of tungsten and molybdenum, and said at least one layer with a low acoustic impedance is formed of silicon oxide.

11. A component operating with bulk acoustic waves, said component comprising:

a carrier substrate;

a lower electrode that faces said carrier substrate;

an upper electrode;

a piezoelectric layer between said lower electrode and said upper electrode; and an acoustic mirror between said carrier substrate and said lower electrode, said acoustic mirror comprising at least one layer with a high acoustic impedance and at least one layer with low acoustic impedance arranged in a stack, said at least one layer of low acoustic impedance including an uppermost mirror layer of said stack, said at least one layer with high acoustic impedance being formed as a structured said uppermost mirror layer exhibiting a varying thickness, an upper boundary surface of said uppermost mirror layer being planar to said lower electrode, and said uppermost layer enclosing structures of said structured layer and forming a seal with a layer of said at least one layer with a low acoustic impedance or with said carrier substrate outside of an area covered by said structure said carrier substrate including a plurality of dielectric layers with at least one metallized plane being provided between successive ones of said dielectric layers.

12. A component according to claim 11, wherein said at least one layer with high acoustic impedance includes a plurality of layers which are structured.

13. A component according to claim 12, wherein said at least one layer with high acoustic impedance is formed of a material selected from a group consisting of tungsten and molybdenum, and said at least one layer with low impedance is formed of silicon oxide.

14. A component according to claim 11, wherein at least one of said upper electrode and said lower electrode is formed by a plurality of layers.

15. A component according to claim 11, wherein said at least one layer with high acoustic impedance is of a metal selected from a group consisting of tungsten and molybdenum, and said at least one layer with a low acoustic impedance is formed of silicon oxide.

16. A method to produce a component operating with bulk acoustic waves, said method comprising the steps of:

providing a carrier substrate;

forming an acoustic mirror on the carrier substrate by depositing a layer with a high acoustic impedance on the carrier substrate;

structuring the layer of high acoustic impedance to form a structured layer;

depositing an uppermost mirror layer with a low acoustic impedance on the structured layer;

thinning and planarizing an upper surface of the uppermost mirror layer to form a planar surface;

forming a lower electrode on the planar surface;

forming a structured piezoelectric layer on the lower electrode; and then forming an upper electrode on the structured piezoelectric layer.

17. A method according to claim 16, wherein the step of thinning the uppermost mirror layer occurs by chemical mechanical polishing.

18. A method according to claim 16, which includes, prior to depositing the uppermost mirror layer, depositing an additional layer of low acoustic impedance on the structured layer, depositing a second layer of high acoustic impedance on the additional layer, and structuring the second layer to form a second structured layer so that the uppermost layer is applied on the second structured layer.

19. A method according to claim 18, wherein the step of thinning the uppermost layer occurs by chemical mechanical polishing.

20. A method according to claim 16, which includes, subsequent to depositing the upper electrode on the piezoelectric layer, depositing a coupling layer, then forming a lower electrode of a second resonator followed by a second piezoelectric layer and a second upper electrode on the coupling layer.

* * * * *